United States Patent [19]
Abe et al.

[11] Patent Number: 5,304,521
[45] Date of Patent: Apr. 19, 1994

[54] DIELECTRIC CERAMIC COMPOSITION CONTAINING ZNO-B₂O₃-SIO₂ GLASS, METHOD OF PREPARING THE SAME, AND RESONATOR AND FILTER USING THE DIELECTRIC CERAMIC COMPOSITION

[75] Inventors: Masahiro Abe; Tsutomu Nanataki; Shinsuke Yano, all of Nagoya, Japan

[73] Assignee: NGK Insulators, Ltd., Japan

[21] Appl. No.: 102,059

[22] Filed: Aug. 4, 1993

Related U.S. Application Data

[62] Division of Ser. No. 948,585, Sep. 23, 1992, Pat. No. 5,264,403.

[30] Foreign Application Priority Data

Sep. 27, 1991 [JP] Japan .................. 3-276587
Mar. 18, 1992 [JP] Japan .................. 4-092180
Mar. 18, 1992 [JP] Japan .................. 4-092182
Mar. 25, 1992 [JP] Japan .................. 4-098862
Sep. 21, 1992 [JP] Japan .................. 4-276594
Sep. 21, 1992 [JP] Japan .................. 4-276595
Sep. 21, 1992 [JP] Japan .................. 4-276596

[51] Int. Cl.⁵ .............................. C04B 35/46
[52] U.S. Cl. .......................... 501/139; 501/32
[58] Field of Search ............... 501/139, 32, 152

[56] References Cited

U.S. PATENT DOCUMENTS

| | | | |
|---|---|---|---|
| 3,811,937 | 5/1974 | Maher ................ | 501/32 |
| 4,220,547 | 9/1980 | Abe et al. ........... | 501/139 |
| 4,283,753 | 8/1981 | Burn ................. | 501/137 |
| 5,073,523 | 12/1991 | Yamada et al. ....... | 501/32 |
| 5,077,247 | 12/1991 | Sato et al. .......... | 501/139 |
| 5,117,326 | 5/1992 | Sano et al. .......... | 501/137 |

FOREIGN PATENT DOCUMENTS

| | | |
|---|---|---|
| 4010827 | 10/1990 | Fed. Rep. of Germany . |
| 4028279 | 3/1991 | Fed. Rep. of Germany . |
| 59-214105 | 12/1984 | Japan . |
| 60-18086 | 5/1985 | Japan . |
| 61-261263 | 11/1986 | Japan . |
| 2187163 | 8/1987 | Japan . |
| 62-216107 | 9/1987 | Japan . |
| 3237304 | 10/1988 | Japan . |
| 1-275466 | 11/1989 | Japan . |
| 2-44609 | 2/1990 | Japan . |
| 3-290358 | 12/1991 | Japan . |
| 3-295855 | 12/1991 | Japan . |
| 3-295856 | 12/1991 | Japan . |
| 4-16884 | 3/1992 | Japan . |
| 692810 | 10/1979 | U.S.S.R. . |

OTHER PUBLICATIONS

Database WPI Week 7605, Derwent Publications Ltd., London, GB; AN 76-08845X & SU-A-460271 (A. V. Matvievskii) Aug. 7, 1975.
Database WPI Week 7626, Derwent Publications Ltd., London, GB; AN 76-49610X & SU-A-494369 (A. V. Matvievskii) Dec. 8, 1975.

*Primary Examiner*—Mark L. Bell
*Assistant Examiner*—Deborah Jones
*Attorney, Agent, or Firm*—Parkhurst, Wendel & Rossi

[57] ABSTRACT

A dielectric ceramic composition is disclosed which consists essentially of: a main ceramic composition containing barium oxide, titanium oxide, rare earth oxide and bismuth oxide as major components, which composition is represented by $xBaO \cdot yTiO_2 \cdot z[(1-a)RE_2O_3 \cdot aBi_2O_3]$ where RE represents at least one rare earth metal, $0.10 \leq x \leq 0.20$, $0.60 \leq y \leq 0.75$, $0.10 \leq z \leq 0.25$, $x+y+z=1$ and $0 < a \leq 0.3$; and a glass composition composed of ZnO, $B_2O_3$ and $SiO_2$, which is represented by $k(wt.\%)ZnO \cdot m(wt.\%)B_2O_3 \cdot n(wt.\%)SiO_2$ where $30 \leq k \leq 85$, $5 \leq m \leq 50$, $2 \leq n \leq 40$, $k+m+n=100$. The glass composition is contained in an amount of at least 0.1 part by weight, but not more than (18-62.5a) parts by weight (where $0 < a \leq 0.2$) or not more than 5.5 parts by weight (where $0.2 < a \leq 0.3$), per 100 parts by weight of the main ceramic composition. The main ceramic composition may have another combination of major components. Also disclosed are a method of preparing the dielectric ceramic composition as described above, a dielectric resonator and filter using such a dielectric ceramic composition, and a method of producing such a dielectric resonator or filter.

9 Claims, No Drawings

DIELECTRIC CERAMIC COMPOSITION CONTAINING ZNO-B$_2$O$_3$-SIO$_2$ GLASS, METHOD OF PREPARING THE SAME, AND RESONATOR AND FILTER USING THE DIELECTRIC CERAMIC COMPOSITION

This is a division of application Ser. No. 07/948,585 filed Sep. 23, 1992, now U.S. Pat. No. 5,264,403.

BACKGROUND OF THE INVENTION

1. Field of the Invention

The present invention relates in general to a dielectric ceramic composition suited for low temperature firing, and a method of preparing the same. In particular, the invention is concerned with a dielectric ceramic composition for microwave applications, which can be fired at a relatively low temperature, and which is suitably used for a dielectric resonator having internal conductive layers, of a stripline type filter, for example, and with a method of preparing such a dielectric ceramic composition. The present invention is also concerned with a dielectric resonator obtained by using such a dielectric ceramic composition, a dielectric filter including a plurality of such dielectric resonators, and with a method of producing the dielectric resonator or dielectric filter.

2. Discussion of the Prior Art

In a modern microwave telecommunication system such as a portable or automobile telephone system, there is widely used a coaxial type dielectric filter using a ceramic composition having a high dielectric constant. The coaxial type dielectric filter has a plurality of coaxial type resonators connected to each other. Each resonator is a cylindrical dielectric block which has inside and outside conductors formed on inner and outer circumferential surfaces of the block, respectively. This type of dielectric filter has a limitation in reducing the size and thickness thereof due to its construction. In view of this, there is proposed a stripline type filter of a tri-plate structure, which incorporates internal conductive layers or strips within a dielectric substrate. In this stripline type filter, a patterned array of conductors in the form of strips are integrally embedded in the dielectric substrate so as to provide a plurality of resonators. The thus constructed stripline type filter is comparatively compact and thin.

In fabricating such a stripline type dielectric filter having the internal conductive layers or strips as described above, a dielectric ceramic composition must be co-fired with the internal conductive layers. Since known dielectric ceramic compositions have a considerably high firing temperature, there is a limit to conductive materials which can be used for the internal conductive layers, thus making it difficult to employ an Ag-contained material having a relatively low conductivity resistance. For instance, the firing temperature of the dielectric ceramic composition must not exceed 1000° C. when Ag-Pd or Ag-Pt alloys are used for the internal conductive layers, and, in particular, must be controlled to be around 900° C. when the conductive layers are formed solely of Ag having a low conductivity resistance. To meet the needs, it is required to provide a dielectric ceramic composition which can be fired at a sufficiently low temperature while assuring excellent microwave characteristics.

Among various dielectric ceramic compositions which have been proposed, a dielectric ceramic composition which contains oxides of Ba, Ti, RE (rare earth metals) and Bi is known as having a high specific dielectric constant, a large unloaded Q, and a small temperature coefficient of the resonance frequency. This composition, however, has a problem in its firing temperature as high as 1300°–1400° C., and various attempts have been made to reduce the firing temperature, by the addition of oxides of Pb, for example.

An example of such dielectric ceramic composition is disclosed in U.S. Pat. No. 3,811,937, wherein a calcined mixture of BaO, TiO$_2$ and a rare earth oxide is blended with 8 to 30% by weight of a glass formulation containing CdO, PbO and Bi$_2$O$_3$. The thus prepared composition is fired at a temperature between about 982° C. and 1150° C. Another example of dielectric ceramic composition as disclosed in JP-A-59-214105 contains BaO, TiO$_2$ and Nd$_2$O$_3$ as major components, which are mixed with powders of PbO, Bi$_2$O$_3$, SiO$_2$ and ZnO. This composition is fired at a temperature between 1050° C. and 1100° C. A further example of composition as disclosed in JP-B2-4-16884 contains BaTiO$_3$, Nd$_2$O$_3$, TiO$_2$ and Bi$_2$O$_3$ as major components, to which Pb$_3$O$_4$, B$_2$O$_3$, SiO$_2$ and ZnO are added in respective suitable amounts. This composition is fired at a temperature between 1000° C. and 1050° C. A still further example of dielectric ceramic composition as disclosed in JP-A-2-44609 contains BaTiO$_3$, Nd$_2$O$_3$, TiO$_2$, Bi$_2$O$_3$ and Pb$_3$O$_4$ as major components, to which 2CaO.3B$_2$O$_3$, SiO$_2$ and ZnO are added. This composition is fired at a temperature between 1000° C. and 1050° C.

The known dielectric ceramic compositions as described above, which can be fired at a relatively low temperature, still has a firing temperature of around 1000° C. or higher, and thus cannot be used with internal conductors formed solely of Ag having a low conductivity resistance, or alloys consisting principally of Ag. In fact, these compositions can be used only with internal conductors formed of Ag-Pd alloys including a relatively high content of Pd having a large conductivity resistance. The known low firing temperature dielectric ceramic compositions, which contain a relatively large amount of Pb oxides, also have some problem upon handling thereof, in view of the toxicity of the Pb oxides.

While some known techniques are available for lowering the firing temperature of a dielectric ceramic composition down to around 1000° C., there have been unknown such techniques as permitting the firing at a temperature lower than the melting point of Ag, i.e., 962° C., desirably at 950° C. or lower, more desirably at around 900° C.

SUMMARY OF THE INVENTION

The present invention was developed in the light of the prior art situations described above. It is therefore a first object of the invention to provide a low temperature firing dielectric ceramic composition which gives dielectric ceramics having a relatively high specific dielectric constant, a relatively large unloaded Q and a relatively small temperature coefficient of the resonance frequency, and which can be fired or sintered at a temperature of not higher than 962° C. (the melting point of Ag), preferably at around 900° C., without requiring the addition of a large amount of Pb oxides.

It is a second object of the invention to provide a method of preparing such a dielectric ceramic composition as described above.

It is a third object of the invention to provide a dielectric resonator obtained by using such a dielectric ceramic composition as described above. It is a fourth object of the invention to provide a dielectric filter including such dielectric resonators. It is a fifth object of the invention to provide a method of producing such a dielectric resonator or dielectric filter.

Having made various attempts and analyses to accomplish the first object, the inventors found that a dielectric ceramic composition containing BaO, $TiO_2$, $RE_2O_3$ and $Bi_2O_3$ as major components can be fired at a significantly lowered temperature, while assuring excellent dielectric properties, by adding a relatively small amount of suitable glass containing ZnO, $B_2O_3$ and $SiO_2$ to the major components.

Namely, the first object may be accomplished according to a first aspect of the present invention, which provides a dielectric ceramic composition which consists essentially of: a main ceramic composition containing barium oxide, titanium oxide, rare earth oxide and bismuth oxide as major components, which composition is represented by $xBaO.yTiO_2.z[(1-a)RE_2O_3.aBi_2O_3]$ where RE represents at least one rare earth metal, $0.10 \leq x \leq 0.20$, $0.60 \leq y \leq 0.75$, $0.10 \leq z \leq 0.25$, $x+y+z=1$ and $0 < a \leq 0.3$; and a glass composition composed of ZnO, $B_2O_3$ and $SiO_2$, which is represented by $k$(wt. %)ZnO. $m$(wt. %)$B_2O_3$.$n$(wt. %)$SiO_2$ where $30 \leq k \leq 85$, $5 \leq m \leq 50$, $2 \leq n \leq 40$, $k+m+n=100$, the glass composition being contained in an amount of at least 0.1 part by weight, but not more than (18–62.5a) parts by weight (where $0 < a \leq 0.2$) or not more than 5.5 parts by weight (where $0.2 < a \leq 0.3$), per 100 parts by weight of the main ceramic composition. This dielectric ceramic composition may be fired at a relatively low temperature, assuring excellent microwave characteristics.

According to one feature of the above aspect of the invention, the main ceramic composition further contains not more than 2.5 parts by weight of alumina per 100 parts by weight of a total amount of the major components. In this case, the dielectric ceramic composition may be fired at a relatively low temperature, assuring a further improved unloaded Q.

According to another feature of the above aspect of the invention, the main ceramic composition further contains not more than 3 parts by weight of manganese oxide per 100 parts by weight of a total amount of the major components. In this case, the dielectric ceramic composition can be co-fired with a conductor material at a relatively low temperature, assuring a sufficiently high specific dielectric constant, a further improved unloaded Q and a significantly reduced temperature coefficient of the resonance frequency.

The second object indicated above may be attained according to a second aspect of the invention, which provides a method of preparing the dielectric ceramic composition as described above, comprising the steps of: excluding at least a part of bismuth oxide from starting materials which give the main ceramic composition, calcining and pulverizing a mixture of the starting materials to provide a calcined ceramic powder; and blending the calcined ceramic powder with the at least a part of bismuth oxide and the glass composition composed of ZnO, $B_2O_3$ and $SiO_2$. According to this method, the firing temperature of the dielectric ceramic composition obtained can be considerably lowered.

According to one feature of the second aspect of the invention, the mixture of the starting materials is calcined at 1050° C. or higher to provide a calcined mixture. Further, the calcined mixture may be finely pulverized so that the calcined ceramic powder has an average grain size of not larger than 0.8 μm. In this case, the firing temperature of the dielectric ceramic composition obtained is remarkably lowered, while the specific dielectric constant and unloaded Q thereof are significantly improved or increased.

In the dielectric ceramic compositions according to the above-indicated first aspect of the invention, if the content of BaO is smaller than 10 mole % ($x < 0.10$), the specific dielectric constant of the obtained dielectric ceramics is undesirably lowered. If the BaO content exceeds 20 mole % ($x < 0.20$), the dielectric ceramics suffer from an excessively large temperature coefficient of the resonance frequency. If the $TiO_2$ content of the dielectric ceramic compositions is smaller than 60 mole % ($y < 0.60$), it becomes difficult to sinter the ceramic composition to give a sintered ceramic body having a sufficiently high density. If the $TiO_2$ content exceeds 75 mole % ($y > 0.75$), the temperature coefficient of the resonance frequency undesirably goes highly positive.

If the total content of $RE_2O_3$ and $Bi_2O_3$, i.e., the above-indicated term $[(1-a)RE_2O_3.aBi_2O_3]$ is smaller than 10 mole % ($z > 0.10$), the temperature coefficient of the resonance frequency undesirably goes highly positive. If the total content of $RE_2O_3$ and $Bi_2O_3$ exceeds 25 mole % ($z > 0.25$), the sinterability of the composition is deteriorated, resulting in reduction in the specific dielectric constant.

According to another feature of the first aspect of the present invention, RE (rare earth metal) present in $RE_2O_3$ is selected from Nd, Sm, La, Ce, Pr and other rare earth metals. Preferably, RE consists of Nd, or a combination of Nd and Sm and/or La. When Nd is used in combination with Sm and/or La, the temperature coefficient of the resonance frequency can be appropriately controlled while assuring high specific dielectric constant and large unloaded Q. In this case, however, it is desirable that the proportion of Sm and/or La to the whole RE is equal to or smaller than 20 mole %. If it exceeds 20 mole %, the temperature coefficient of the resonance frequency is varied to a great extent in the positive or negative direction. On the other hand, the amount of Ce or Pr that is introduced into the ceramic composition as RE is determined as converted into trivalent atoms.

When a portion of $RE_2O_3$ is substituted by $Bi_2O_3$, the specific dielectric constant can be increased while the temperature coefficient of the resonance frequency can be reduced. It is particularly desirable to substitute at least 5 mole % ($a \geq 0.05$) of $RE_2O_3$, so as to achieve satisfactory effects due to the substitution by $Bi_2O_3$. Since the temperature coefficient comes to undesirably increase if the substituting amount of $Bi_2O_3$ reaches 15–20 mole % or more, and the unloaded Q decreases with an increase in the substituting amount of $Bi_2O_3$, the practical substituting amount of $Bi_2O_3$ is appropriately kept to be not more than 30 mole % ($a \leq 0.30$).

The dielectric ceramic compositions according to the above aspect of the invention consists essentially of the major ceramic composition containing barium oxide, titanium oxide, rare earth oxide and bismuth oxide in the above-indicated proportion, and a suitable amount of the glass composition as described below. However, suitable metal oxide, such as alumina, iron oxide, manganese oxide, chromium oxide, zinc oxide, stannic oxide (tin oxide), or zirconia, may be added to the main ceramic composition as described above, in an attempt to improve the unloaded Q and suitably adjust or control the temperature coefficient of the resonance frequency. In particular, the addition of alumina to the above ceramic composition is considerably effective to further improve the unloaded Q. On the other hand, manganese oxide functions to prevent reduction of the main ceramic composition, and therefore favorably permits co-firing thereof with copper conductors, for example, in a nitrogen atmosphere. The addition of the manganese oxide is also effective to improve the unloaded Q while maintaining a sufficiently high dielectric constant, and decreases the temperature coefficient of the resonance frequency. The alumina and the manganese oxide are respectively added to the main ceramic composition consisting of barium oxide, titanium oxide, rare earth oxide and bismuth oxide, in amounts of up to 2.5 and up to 3 parts by weight, respectively, per 100 parts by weight of the above main ceramic composition, preferably, in amounts of up to 2 parts by weight.

The glass composition of the $ZnO-B_2O_3-SiO_2$ system in the present dielectric ceramic composition consists of 30–85% by weight of zinc oxide (ZnO), 5–50% by weight of boric oxide ($B_2O_3$), and 2–40% by weight of silicon oxide ($SiO_2$). Namely, when the contents of zinc oxide, boric oxide and silicon oxide are respectively represented by k wt. %, m wt. % and n wt. %, it is necessary to satisfy the following formulas: $30 \leq k \leq 85$, $5 \leq m \leq 50$, $2 \leq n \leq 40$, and $k+m+n=100$. The addition of ZnO, $B_2O_3$ and $SiO_2$ in the form of glass to the main ceramic composition is effective to lower the firing temperature of the dielectric ceramic composition obtained. Of the constituent elements of the glass, $SiO_2$ is considered particularly important in forming glass. Namely, the $SiO_2$ element does not only facilitate vitrification of the composition, but also stabilize the glass obtained.

If the content (k) of ZnO is smaller than 30% by weight, the glass composition is less likely to be vitrified to form a desired glass. If the ZnO content (k) exceeds 85% by weight, the glass composition is hard to be vitrified, and the firing temperature of the dielectric ceramic composition prepared is undesirably increased. If the content (m) of $B_2O_3$ is smaller than 5% by weight, the vitrification of the glass composition becomes difficult, and the firing temperature of the dielectric ceramic composition is undesirably increased. If the $B_2O_3$ content (m) exceeds 50% by weight, the dielectric ceramics obtained suffers from reduction in the unloaded Q. If the $SiO_2$ content (n) exceeds 40% by weight, the glass composition is hard to be vitrified, and the firing temperature of the dielectric ceramic composition prepared is increased. The inclusion of $SiO_2$ in the glass composition results in easy vitrification of the composition, whereby the dielectric ceramic composition containing the thus formed glass can be fired at a significantly lowered temperature, assuring excellent microwave characteristics.

The preferred composition range of the $ZnO-B_2O_3-SiO_2$ glass is such that the ZnO content (k) is in a range of 40–75 wt. %, the $B_2O_3$ content (m) is in a range of 10–40 wt. %, and the $SiO_2$ content (n) is in a range of 5–30 wt. %. While the thus prepared glass composition may be allowed to include impurities such as various metal oxides, it is to be generally understood that the content of such impurities in the glass composition must be kept to be not more than 10% by weight. Further, the $ZnO-B_2O_3-SiO_2$ glass used for the present invention may not be entirely uniformly vitrified. Namely, the $ZnO-B_2O_3-SiO_2$ glass may have different phases from portion to portion, or may include a portion formed of unvitrified materials, or may be partially crystallized, as long as the glass is substantially in a vitrified condition.

The $ZnO-B_2O_3-SiO_2$ glass having the above-described composition is contained as a secondary component in the present dielectric ceramic composition, in an amount of at least 0.1 part by weight, but not more than (18–62.5a) parts by weight (where $0<a\leq0.2$) or not more than 5.5 parts by weight (where $0.2<a\leq0.3$), per 100 parts by weight of the main ceramic composition as described above, whereby the firing temperature of the dielectric ceramic composition obtained can be lowered to 962° C. or lower, desirably 950° C. or lower, more desirably around 900° C. If the content of the glass is smaller than 0.1 part by weight, the addition of the glass component does not yield a satisfactory effect to lowering the firing temperature. If the content of the glass exceeds (18–62.5a) parts by weight where $0<a\leq0.2$), or exceeds 5.5 parts by weight where $0.2<a\leq0.3$, the dielectric ceramics obtained have an excessively reduced unloaded Q, and are thus not suitable for practical use.

The dielectric ceramic composition according to the first aspect of the present invention is prepared by blending the main ceramic composition as described above, with the above $ZnO-B_2O_3-SiO_2$ glass composition. Prior to the addition (blending) of the $ZnO-B_2O_3-SiO_2$ glass, a mixture of starting materials giving the main ceramic composition is calcined and then pulverized. When the calcining temperature is 900° C. or higher, the firing temperature of the dielectric ceramic composition is reduced while the specific dielectric constant and unloaded Q are increased, due to the relatively high calcining temperature. Preferably, the calcining of the main ceramic composition is carried out at a temperature of 1050° C. or higher, so as to most effectively yield the above effects or advantages. If the calcining temperature exceeds 1350° C., however, the calcined mass is likely to excessively harden after the calcining process, causing some problem in handling thereof. Therefore, the calcining temperature is preferably held between 1100° C. and 1300° C.

In pulverizing the thus calcined mass, the smaller the average grain size of a ceramic powder obtained as a result of pulverization, the lower the firing temperature of the dielectric ceramic composition obtained, resulting in increases in the specific dielectric constant and unloaded Q. Accordingly, according to the present invention, the calcined mass is pulverized to achieve the average grain size of not larger than 0.8 μm. If the average grain size of the ceramic powder is smaller than 0.1 μm, however, the formability of the dielectric ceramic composition obtained is deteriorated, making it difficult to form a tape by an ordinary doctor blade technique, for example. Therefore, the average grain size of the ceramic powder is desirably controlled to within a range of about 0.1~0.8 μm. Generally, such a small grain size of the ceramic powder is measured by a laser diffraction and scattering method.

In preparing the dielectric ceramic compositions according to the above first aspect of the invention, at least a part of bismuth oxide as one major component of the main ceramic composition may be added later to the main ceramic composition, together with the $ZnO-B_2O_3-SiO_2$ glass component. Namely, at least a part of bismuth oxide is excluded from starting materials which will give the main ceramic composition as described above, and a mixture of the starting materials is calcined and pulverized. The calcined mixture thus pulverized is blended with the bismuth oxide excluded, together with the $ZnO-B_2O_3-SiO_2$ glass component. Consequently, the firing temperature of the dielectric ceramic composition thus obtained can be effectively lowered, i.e., the higher the proportion of the bismuth oxide added later, the lower the firing temperature. In this regard, the proportion of the bismuth oxide added later is desirably kept to be not more than 50% by weight, since the unloaded Q decreases if the proportion exceeds 50% by weight. Namely, up to 50% by weight of bismuth oxide may be added later to the main ceramic composition.

The above-indicated first object of the present invention may be also attained according to a third aspect of the present invention, while provides a dielectric ceramic composition which consists essentially of: a main ceramic composition containing barium oxide, titanium oxide and rare earth oxide as major components, which composition is represented by $xBaO.yTiO_2.zRE_2O_3$ where RE represents at least one rare earth metal, $0.10 \leq x \leq 0.20$, $0.60 \leq y \leq 0.75$, $0.10 \leq z \leq 0.25$, and $x+y+z=1$; and a glass composition composed of ZnO, $B_2O_3$ and $SiO_2$, which is represented by $k(wt. \%)ZnO.m(wt. \%)B_2O_3.n(wt. \%)SiO2$ where $30 \leq k \leq 85$, $5 \leq m \leq 50$, $2 \leq n \leq 40$, $k+m+n=100$, the glass composition being contained in an amount of $0.1 \sim 18$ parts by weight per 100 parts by weight of the main ceramic composition.

The main ceramic composition may further contain not more than 2.5 parts by weight of alumina per 100 parts by weight of a total amount of the major components. In this case, the dielectric ceramic composition obtained may be fired at a relatively low temperature, assuring a significantly improved unloaded Q.

Alternatively, the main ceramic composition may further contains not more than 3 parts by weight of manganese oxide per 100 parts by weight of a total amount of the major components. In this case, the dielectric ceramic composition can be co-fired with copper conductors, for example, in a nitrogen atmosphere, assuring a further improved unloaded Q and a significantly reduced temperature coefficient of the resonance frequency.

In the dielectric ceramic composition as defined just above, the contents of BaO and $TiO_2$ are held within the respective specified ranges, for the same reasons as given above with respect to the dielectric ceramic composition according to the first aspect of the invention.

If the content of $RE_2O_3$ in the above dielectric ceramic composition is smaller than 10 mole % ($z > 0.10$), the temperature coefficient of the resonance frequency undesirably goes highly positive. If the content of $RE_2O_3$ exceeds 25 mole % ($z > 0.25$), the sinterability of the composition is deteriorated, resulting in reduction in the specific dielectric constant.

Further, RE present in $RE_2O_3$ may be selected from the above-indicated rare earth metals referred to above with respect to the dielectric ceramic composition according to the first aspect of the invention. When Nd is used in combination with Sm and/or La, it is desirable that the proportion of Sm and/or La to the whole RE is equal to or smaller than 40 mole %. If it exceeds 40 mole %, the temperature coefficient of the resonance frequency is varied to a great extent in the positive or negative direction.

As described above with respect to the first aspect of the invention, suitable metal oxide, such as alumina, iron oxide, manganese oxide, chromium oxide, zinc oxide, stannic oxide (tin oxide), or zirconia, may be added in a suitable proportion to the main ceramic composition in the $BaO-TiO_2-RE_2O_3$ system, for the same purposes as described above.

In the present dielectric ceramic composition, the contents of ZnO, $B_2O_3$ and $SiO_2$ in the glass composition are held within the respective specified ranges, for the same reasons as given above with respect to the dielectric ceramic composition according to the first aspect of the invention.

The $ZnO-B_2O_3-SiO_2$ glass having the above-described composition is contained as a secondary component in the present dielectric ceramic composition, in an amount of $0.1 \sim 18$ parts by weight per 100 parts by weight of the main ceramic composition as described above, whereby the firing temperature of the dielectric ceramic composition obtained can be lowered to 962° C. (melting point of Ag) or lower, desirably 950° C. or lower, more desirably around 900° C. If the content of the glass is smaller than 0.1 part by weight, the addition of the glass component does not yield a satisfactory effect of lowering the firing temperature. If the content of the glass exceeds 18 parts by weight, the dielectric ceramics obtained have an excessively reduced unloaded Q, and are thus not suitable for practical use.

In preparing the dielectric ceramic composition as described above, the main ceramic composition of the $BaO-TiO_2-RE_2O_3$ system is preferably calcined at 1050° C. or higher, more preferably, at a temperature between 1100° C. and 1300° C.

The thus calcined mass of the main ceramic composition is pulverized to achieve the average grain size of not larger than 0.8 $\mu$m. Preferably, the average grain size of the ceramic powder is controlled to within a range of about $0.1 \sim 0.8$ $\mu$m.

The above-described first object may be also attained according to a fourth aspect of the present invention, which provides a dielectric ceramic composition which consists essentially of: a main ceramic composition containing barium oxide, strontium oxide, calcium oxide, titanium oxide, rare earth oxide and bismuth oxide as major components, which composition is represented by $x[(1-c-d)BaO.cSrO.dCaO].yTiO_2.z[(1-e)RE_2O_3.eBi_2O_3]$ where RE represents at least one rare earth metal, $0.10 \leq x \leq 0.20$, $0.60 \leq y \leq 0.75$, $0.10 \leq z \leq 0.25$, $x+y+z=1$, $0 \leq c \leq 0.40$, $0 \leq d \leq 0.20$, $0 \leq e \leq 0.30$ and $0 < c+d$; and a glass composition composed of ZnO, $B_2O_3$ and $SiO_2$, which is represented by $k(wt. \%)ZnO.m(wt. \%)B_2O_3.n(wt. \%)SiO2$ where $30 \leq k \leq 85$, $5 \leq m \leq 50$, $2 \leq n \leq 40$, $k+m+n=100$, the glass composition being contained in an amount of at least 0.1 part by weight, but not more than $(18-62.5e)$ parts by weight (where $0 \leq e \leq 0.2$) or not more than 5.5 parts by weight (where $0.2 \leq e \leq 0.3$), per 100 parts by weight of the main ceramic composition.

In the dielectric ceramic composition as defined just above, the term "$x[(1-c-d)BaO.cSrO.dCaO]$" of the main ceramic composition indicates that a portion of BaO as one major component is substituted by SrO and/or CaO. If the total content of BaO, SrO and CaO is smaller than 10 mole % ($x < 0.10$), the specific dielectric constant of the obtained dielectric ceramic is undesirably lowered. If the total content exceeds 20 mole % ($x > 0.20$), the dielectric ceramics suffer from an excessively large temperature coefficient of the resonance frequency.

The partial substitution of BaO is carried out by using at least one of SrO and CaO. When a portion of BaO is substituted by SrO, for example, the unloaded Q may be improved and the temperature coefficient of the resonance frequency may be reduced due to the substitution, while maintaining a high specific dielectric constant. If the proportion of the substitution by SrO exceeds 0.40 ($c > 0.40$), however, the dielectric constant and unloaded Q are both deteriorated. When a portion of BaO is substituted by CaO, the temperature coefficient of the resonance frequency may be increased while maintaining high specific dielectric constant and large unloaded Q. If the proportion of the substitution by CaO exceeds 0.20 ($d < 0.20$), however, the unloaded Q is rapidly deteriorated. Accordingly, the temperature coefficient of the resonance frequency may be advantageously controlled by the addition of suitable amounts of SrO and/or CaO.

In the dielectric ceramic composition as defined just above, the content (mole %) of $TiO_2$ is held within the specified range, i.e., $0.60 \leq y \leq 0.75$, for the same reason as given above with respect to the dielectric ceramic composition according to the first aspect of the invention.

The total amount of $RE_2O_3$ and $Bi_2O_3$, i.e., the above-indicated term $[(1-e)RE_2O_3$ and $eBi_2O_3]$, is also held within the specified range indicated above, i.e., $0.10 \leq z \leq 0.25$, for the same reason as given above with respect to the total amount of $RE_2O_3$ and $Bi_2O_3$ in the dielectric ceramic composition according to the first aspect of the invention.

Further, RE present in $RE_2O_3$ may be selected from the rare earth metals indicated above with respect to the dielectric ceramic compositions according to the first aspect of the invention. When Nd is used in combination with Sm and/or La, it is desirable that the proportion of Sm and/or La to the whole RE is equal to or smaller than 20 mole %. If it exceeds 20 mole %, the temperature coefficient of the resonance frequency is varied to a great extent in the positive or negative direction.

The substitution of $RE_2O_3$ by $Bi_2O_3$ is effected such that the substituting amount of $Bi_2O_3$ is kept within the specified range indicated above, i.e., $0 \leq e \leq 0.30$, preferably, $0.05 \leq e \leq 0.30$, for the same reason as given above with respect to the dielectric ceramic composition according to the first aspect of the invention.

As described above with respect to the first aspect of the invention, suitable metal oxide, such as alumina, iron oxide, manganese oxide, chromium oxide, zinc oxide, stannic oxide (tin oxide), or zirconia, may be added to the above main ceramic composition in the $BaO-SrO-CaO-TiO_2-RE_2O_3-Bi_2O_3$ system, in order to improve the unloaded Q and suitably adjust or control the temperature coefficient of the resonance frequency.

In the present dielectric ceramic composition, the contents of ZnO, $B_2O_3$ and $SiO_2$ in the glass composition are held within the respective specified ranges, for the same reasons as given above with respect to the dielectric ceramic composition according to the first aspect of the invention.

As described above, the preferred composition range of the $ZnO-B_2O_3-SiO_2$ glass is such that the ZnO content ($k$) is in a range of 40–75 wt. %, the $B_2O_3$ content ($m$) is in a range of 10–40 wt. %, and the $SiO_2$ content ($n$) is in a range of 5–30 wt. %.

The content of the $ZnO-B_2O_3-SiO_2$ glass having the above-described composition in the present dielectric ceramic composition is kept within the specified range indicated above, for the same reasons as given above with respect to the dielectric ceramic composition according to the first aspect of the present invention. Preferably, the $ZnO-B_2O_3-SiO_2$ glass is contained in the present dielectric ceramic composition, in an amount of 1–3 parts by weight, per 100 parts by weight of the main ceramic composition.

In preparing the present dielectric ceramic composition, the main ceramic composition as described above is preferably calcined at 1050° C. or higher, more preferably, at a temperature between 1100° C. and 1300° C.

The thus calcined mass of the main ceramic composition is pulverized to achieve the average grain size of not larger than 0.8 μm. Preferably, the average grain size of the ceramic powder obtained is controlled to within a range of about 0.1~0.8 μm.

In preparing the present dielectric ceramic composition, at least a part of bismuth oxide in the main ceramic composition may be added later to the main ceramic composition, along with the $ZnO-B_2O_3-SiO_2$ glass component. The proportion of the bismuth oxide added later is desirably kept to be not more than 50% by weight.

The third object of the invention indicated above may be achieved according to a fifth aspect of the invention, which provides a dielectric resonator comprising: a dielectric ceramic obtained by firing a dielectric ceramic composition according to any one of the first, second and third aspects of the invention which have been described above; and a conductor pattern which is formed by co-firing with the dielectric ceramic so that the conductor pattern is embedded in the dielectric ceramic.

The fourth object of the invention indicated above may be achieved according to a sixth aspect of the invention, which provides a dielectric filter including a plurality of dielectric resonators according to the above fifth aspect of the invention.

The fifth object of the invention indicated above may be achieved according to a seventh aspect of the invention, which provides a method of producing a dielectric resonator including a dielectric ceramic and a conductor pattern embedded in the dielectric ceramic, or a dielectric filter including the dielectric resonator, characterized in that a dielectric ceramic composition according to any one of the first, second and third aspects of the invention is co-fired with a conductive layer formed solely of Ag or of an alloy containing Ag as a major component, so as to give the dielectric ceramic and the conductor pattern.

EXAMPLES

To further clarify the concept of the present invention, some examples of the invention will be described. It is to be understood that the invention is not limited to the details of the illustrated examples, but may be embodied with various alterations, modifications and improvements, which may occur to those skilled in the art, without departing from the scope of the invention defined in the appended claims.

EXAMPLE 1

Initially, highly pure barium carbonate, titanium oxide, neodymium oxide, samarium oxide, lanthanum oxide and bismuth oxide were weighed to give main ceramic compositions corresponding to samples No. 1 to No. 33 and represented by the formula: $xBaO \cdot yTiO_2 \cdot z[(1-a)RE_2O_3 \cdot aBi_2O_3]$ wherein x, y, z, RE and a are as indicated in TABLES 1 and 2. The thus weighed materials, from which a given proportion of bismuth oxide to be added later was excluded, were wet-blended with some pure water in a polyethylene pot mill using alumina balls. The thus obtained mixture was taken out of the pot mill, dried, put into an alumina crucible (pot), and calcined in air for four hours at various temperatures between 900° C. and 1270° C. Then, the calcined mixture was roughly crushed, thrown back into the polyethylene pot mill with zirconia balls, and pulverized to achieve the average grain size of 0.4~1.0 μm as measured by a laser diffraction and scattering method. In this manner, calcined ceramic powders of respective compositions were obtained.

On the other hand, highly pure zinc oxide, boric oxide and silicon oxide were weighed in the proportion of 65% by weight of ZnO, 25% by weight of $B_2O_3$ and 10% by weight of $SiO_2$. These compounds were thrown with alumina balls into a polyethylene pot mill, and dry-blended. The thus obtained mixture was fused in a chamotte crucible, rapidly cooled off in water and thus vitrified. The glass obtained was thrown with alumina balls into an alumina pot mill, and pulverized in ethanol to achieve the average grain size of 4 μm, to thereby provide a glass powder having a composition (G) as indicated in TABLE 3.

Subsequently, each of the calcined ceramic powders of the test compositions was wet-blended in pure water with the bismuth oxide to be added later, and a predetermined amount (as indicated in TABLES 1 and 2) of the glass having the composition (G), in a polyethylene pot mill using alumina balls. At the same time, 1% by weight of polyvinyl alcohol (PVA) was added as a binder. The thus obtained mixture was then dried, passed through a sieve having openings of 355 μm, and thus granulated. In TABLES 1 and 2, $Bi_2O_3$ to be added later to the main ceramic composition (calcined ceramic powder) should be interpreted as the proportion thereof to the total amount of $Bi_2O_3$ used, while the amount of addition of the glass is represented by parts by weight per 100 parts by weight of the total amount of the calcined ceramic powder and $Bi_2O_3$ later added.

The thus prepared granules of each composition were formed with a press at a surface pressure of 1 t/cm², into a circular disc having a diameter of 20 mm and a thickness of 15 mm. The circular discs corresponding to the respective compositions were fired in air for two hours at 900° C., to thereby provide respective samples Nos. 1-33 of dielectric ceramics. These samples were ground into circular discs each having a diameter of 16 mm and a thickness of 8 mm, and the dielectric properties of each sample were measured. More specifically, the specific dielectric constant ($\epsilon r$) and unloaded Q were measured according to Hakki and Coleman method, while the temperature coefficient ($\tau f$) of the resonance frequency was measured over a range from −25° C. to 75° C. The measurement was effected at a frequency of 2–4 GHz. The results of the measurement are also indicated in TABLES 1 and 2.

TABLE 1

| No. | x | y | z | RE | a | $Bi_2O_3$ later added (% by weight) | Calcining temp. (°C.) | Average grain size (μm) | Glass Comp. | Glass Parts by weight | $\epsilon r$ | Q (3 GHz) | $\tau f$ (ppm/°C.) |
|---|---|---|---|---|---|---|---|---|---|---|---|---|---|
| 1 | 0.155 | 0.670 | 0.175 | Nd | 0.15 | 0 | 1250 | 0.6 | G | 2.5 | 68 | 1160 | −1 |
| 2 | 0.155 | 0.670 | 0.175 | Nd | 0.15 | 12.5 | 1250 | 0.6 | G | 2.5 | 70 | 1010 | −2 |
| 3 | 0.160 | 0.670 | 0.170 | Nd | 0.15 | 12.5 | 1250 | 0.6 | G | 2.5 | 74 | 1150 | −1 |
| 4 | 0.160 | 0.670 | 0.170 | Nd | 0.18 | 0 | 1270 | 0.4 | G | 2.0 | 79 | 1100 | −8 |
| 5 | 0.160 | 0.670 | 0.170 | 0.88 Nd + 0.12 La | 0.18 | 0 | 1270 | 0.4 | G | 2.0 | 80 | 1000 | 0 |
| 6 | 0.165 | 0.670 | 0.165 | Nd | 0.15 | 12.5 | 1250 | 0.6 | G | 2.5 | 75 | 970 | 1 |
| 7 | 0.165 | 0.680 | 0.155 | Nd | 0.15 | 12.5 | 1250 | 0.6 | G | 2.5 | 69 | 1070 | 5 |
| 8 | 0.180 | 0.700 | 0.120 | 0.80 Nd + 0.20 Sm | 0.10 | 0 | 1270 | 0.5 | G | 2.0 | 66 | 1400 | 12 |
| 9 | 0.145 | 0.660 | 0.195 | 0.90 Nd + 0.10 La | 0.10 | 0 | 1270 | 0.5 | G | 2.5 | 72 | 1200 | 3 |
| 10 | 0.155 | 0.670 | 0.175 | Nd | 0.10 | 25.0 | 1250 | 0.5 | G | 2.5 | 71 | 1340 | 0 |
| 11 | 0.155 | 0.670 | 0.175 | Nd | 0.15 | 25.0 | 1250 | 0.5 | G | 2.5 | 74 | 840 | −2 |
| 12 | 0.155 | 0.670 | 0.175 | Nd | 0.20 | 25.0 | 1250 | 0.5 | G | 2.5 | 77 | 610 | −4 |
| 13 | 0.155 | 0.670 | 0.175 | 0.97 Nd + 0.03 La | 0.20 | 25.0 | 1250 | 0.5 | G | 2.5 | 78 | 580 | −4 |
| *14 | 0.155 | 0.670 | 0.175 | 0.90 Nd + 0.10 Sm | 0.20 | 25.0 | 1250 | 0.4 | G | 0.0 | 36 | 560 | — |
| 15 | 0.155 | 0.670 | 0.175 | 0.90 Nd + 0.10 Sm | 0.20 | 25.0 | 1250 | 0.4 | G | 1.0 | 76 | 870 | −4 |
| 16 | 0.155 | 0.670 | 0.175 | 0.90 Nd + 0.10 Sm | 0.20 | 25.0 | 1250 | 0.4 | G | 2.0 | 81 | 760 | −5 |
| 17 | 0.155 | 0.670 | 0.175 | 0.90 Nd + 0.10 Sm | 0.20 | 25.0 | 1250 | 0.4 | G | 5.0 | 79 | 480 | −3 |
| *18 | 0.155 | 0.670 | 0.175 | 0.90 Nd + 0.10 Sm | 0.20 | 25.0 | 1250 | 0.4 | G | 6.0 | 77 | 360 | −3 |
| 19 | 0.155 | 0.670 | 0.175 | 0.90 Nd + 0.10 Sm | 0.20 | 50.0 | 900 | 0.6 | G | 2.5 | 47 | 610 | 2 |
| 20 | 0.155 | 0.670 | 0.175 | 0.90 Nd + 0.10 Sm | 0.20 | 50.0 | 1000 | 0.7 | G | 2.5 | 47 | 620 | 2 |
| 21 | 0.155 | 0.670 | 0.175 | 0.90 Nd + 0.10 Sm | 0.20 | 50.0 | 1150 | 0.7 | G | 2.5 | 61 | 500 | 1 |

*comparative example
—: unmeasurable

TABLE 2

| No. | x | y | z | RE | a | $Bi_2O_3$ later added (% by weight) | Calcining temp. (°C.) | Average grain size (μm) | Glass Comp. | Glass Parts by weight | $\epsilon r$ | Q (3 GHz) | $\tau f$ (ppm/°C.) |
|---|---|---|---|---|---|---|---|---|---|---|---|---|---|
| 22 | 0.155 | 0.670 | 0.175 | 0.90 Nd + 0.10 Sm | 0.20 | 25.0 | 1150 | 0.7 | G | 2.5 | 67 | 560 | 1 |
| 23 | 0.155 | 0.670 | 0.175 | 0.90 Nd + 0.10 Sm | 0.20 | 25.0 | 1200 | 0.7 | G | 2.5 | 70 | 560 | −2 |
| 24 | 0.155 | 0.670 | 0.175 | 0.90 Nd + 0.10 Sm | 0.20 | 25.0 | 1250 | 0.8 | G | 2.5 | 70 | 580 | −5 |
| 25 | 0.155 | 0.670 | 0.175 | 0.90 Nd + 0.10 Sm | 0.20 | 25.0 | 1270 | 0.8 | G | 2.5 | 72 | 610 | −7 |
| 26 | 0.155 | 0.670 | 0.175 | 0.90 Nd + 0.10 Sm | 0.20 | 50.0 | 1150 | 1.0 | G | 2.5 | 57 | 460 | 1 |
| 27 | 0.155 | 0.670 | 0.175 | 0.90 Nd + 0.10 Sm | 0.20 | 50.0 | 1150 | 0.8 | G | 2.5 | 62 | 491 | 1 |
| 28 | 0.155 | 0.670 | 0.175 | 0.90 Nd + 0.10 Sm | 0.20 | 50.0 | 1150 | 0.5 | G | 2.5 | 73 | 520 | 0 |
| 29 | 0.155 | 0.670 | 0.175 | 0.90 Nd + 0.10 Sm | 0.20 | 25.0 | 1250 | 0.4 | G | 2.5 | 82 | 690 | −3 |
| 30 | 0.155 | 0.670 | 0.175 | Nd | 0.20 | 0.0 | 1250 | 0.6 | G | 2.5 | 66 | 690 | −3 |

TABLE 2-continued

| No. | x | y | z | RE | a | Bi₂O₃ later added (% by weight) | Calcining temp. (°C.) | Average grain size (μm) | Glass Comp. | Glass Parts by weight | εr | Q (3 GHz) | τf (ppm/°C.) |
|---|---|---|---|---|---|---|---|---|---|---|---|---|---|
| 31 | 0.155 | 0.670 | 0.175 | Nd | 0.20 | 25.0 | 1250 | 0.7 | G | 2.5 | 71 | 660 | −3 |
| 32 | 0.155 | 0.670 | 0.175 | Nd | 0.20 | 50.0 | 1250 | 0.7 | G | 2.5 | 66 | 560 | −3 |
| 33 | 0.155 | 0.670 | 0.175 | Nd | 0.20 | 100.0 | 1250 | 0.9 | G | 2.5 | 65 | 530 | −3 |

EXAMPLE 2

Initially, highly pure barium carbonate, titanium oxide, neodymium oxide, samarium oxide and bismuth oxide were weighed so as to give a main ceramic composition as represented by the above-indicated formula, wherein x, y, z and a are 0.145, 0.675, 0.180 and 0.20, respectively, and RE consists of 0.90 Nd and 0.10 Sm. The weighed materials, from which 5% by weight of bismuth oxide was excluded, were calcined at 1170° C. in the same manner as EXAMPLE 1, and the calcined mass was pulverized to provide a calcined ceramic powder having the average grain size of 0.6 μm.

On the other hand, highly pure zinc oxide, boric oxide and silicon oxide were weighed in respective weight ratios as indicated in TABLE 3 below, vitrified in the same manner as EXAMPLE 1, and then pulverized to provide glass powders of respective compositions, each having the average grain size of 4 μm.

Subsequently, the thus obtained glass powder of each composition was added to the above-indicated calcined ceramic powder, along with later added bismuth oxide (5% by weight), and the mixture was press-formed into a test sample in the same manner as TABLE 1, and fired in air for two hours at 900° C. In this manner, there were obtained samples Nos. 34–52 of dielectric ceramics as indicated in TABLE 4. In TABLE 4, the amount of the glass powder is represented by parts by weight per 100 parts by weight of a total amount of the calcined ceramic powder and later added bismuth oxide.

TABLE 3

| Glass composition | ZnO (k wt. %) | B₂O₃ (m wt. %) | SiO₂ (n wt. %) | Impurities * |
|---|---|---|---|---|
| A | 67 | 22 | 11 | |
| B | 66 | 24 | 10 | Al₂O₃: 2.0 |
| C | 66 | 24 | 10 | MgO: 2.0 |
| D | 66 | 24 | 10 | SnO₂: 2.0 |
| E | 65 | 27 | 8 | |
| F | 65 | 26 | 9 | |
| G | 65 | 25 | 10 | |
| H | 65 | 20 | 15 | |
| I | 63 | 29 | 8 | |
| J | 63 | 28 | 9 | |
| K | 63 | 27 | 10 | |
| L | 63 | 26 | 11 | PbO: 5.3 |
| M | 61 | 29 | 10 | |
| N | 65 | 10 | 25 | |
| O | 54 | 22 | 24 | |
| P | 73 | 24 | 3 | |
| Q | 40 | 30 | 30 | |
| R | 55 | 35 | 10 | |
| S | 45 | 40 | 15 | |

*% by weight with respect to the total amount of major components (ZnO, B₂O₃ and SiO₂) of the glass composition The dielectric properties of each of the fired samples Nos. 34–52 were measured in the same manner as EXAMPLE 1, and the results of the measurement are also indicated in TABLE 4. As will be understood from this table, any of the dielectric ceramics (sintered body) obtained in this example has a sufficiently high dielectric constant, large unloaded Q and a sufficiently small temperature coefficient of the resonance frequency, irrespective of the relatively low firing temperature, i.e., 900° C.

TABLE 4

| No. | Glass Composition | Glass Parts by weight | εr | Q (3 GHz) | τf (ppm/°C.) |
|---|---|---|---|---|---|
| 34 | A | 2.5 | 54 | 520 | — |
| 35 | B | 2.5 | 67 | 600 | −4 |
| 36 | C | 2.5 | 67 | 590 | −2 |
| 37 | D | 2.5 | 67 | 550 | −2 |
| 38 | E | 2.5 | 71 | 550 | −3 |
| 39 | F | 2.5 | 70 | 560 | −3 |
| 40 | G | 2.5 | 68 | 560 | −2 |
| 41 | H | 2.5 | 54 | 600 | — |
| 42 | I | 2.5 | 72 | 570 | −3 |
| 43 | J | 2.5 | 72 | 580 | −1 |
| 44 | K | 2.5 | 70 | 580 | −2 |
| 45 | L | 2.5 | 63 | 610 | −4 |
| 46 | M | 2.5 | 70 | 580 | −2 |
| 47 | N | 2.5 | 52 | 550 | 2 |
| 48 | O | 2.5 | 54 | 580 | 1 |
| 49 | P | 2.5 | 69 | 610 | −4 |
| 50 | Q | 2.5 | 73 | 780 | −1 |
| 51 | R | 2.5 | 74 | 700 | −3 |
| 52 | S | 2.5 | 75 | 650 | −2 |

—: unmeasurable

EXAMPLE 3

The calcined ceramic powder obtained in producing sample No. 7 of TABLE 1 was wet-blended in an alumina pot mill using zirconia balls, with bismuth oxide to be added later (25% by weight of the total amount thereof), the glass powder of ZnO-B₂O₃-SiO₂ system having the composition (G) of TABLE 3, polyvinyl butyral, a plasticizer and a peptizing agent, within a mixed solution of toluene and isopropyl alcohol.

The thus prepared mixture was degassed, and formed by a doctor blade technique into green tapes each having a thickness of 250 μm. Then, a conductor pattern for a 900 MHz 3-resonator bandpass filter was printed on one of the thus formed green tapes, by using an Ag paste suited for printing. Thereafter, 12 sheets of the green tapes, including as an intermediate sheet the above-indicated one tape on which the conductor pattern was printed, were laminated at 100 kgf/cm² at 100° C. The laminated green tapes were cut into segments, and then fired in air for two hours at 900° C., to thereby provide stripline type filters. Upon measurement of the filter characteristics by means of a network analyzer, the thus obtained stripline type filters exhibited a center frequency of 930 MHz, and an insertion loss of 2.8 dB.

EXAMPLE 4

Initially, highly pure barium carbonate, titanium oxide, neodymium oxide and bismuth oxide were weighed so as to give a main ceramic composition as represented by the above-indicated formula, wherein x, y, z and a are 0.155, 0.670, 0.175 and 0.05, respectively. A mixture of these compounds were calcined at 1270° C., and then pulverized to provide a calcined ceramic powder having the average grain size of 0.6 μm, in the same manner as EXAMPLE 1.

Subsequently, the glass powder prepared according to EXAMPLE 2 and having the composition (I) was added in various proportions as indicated in TABLE 5, per 100 parts by weight of the thus obtained calcined ceramic powder. Then, the mixture of the glass powder and calcined ceramic powder was press-formed into a green sheet, and then fired, in the same manner as EXAMPLE 1.

The dielectric properties of each of fired samples No. 53 through No. 57 thus obtained were measured in the same manner as EXAMPLE 1. The results of the measurement are indicated in TABLE 5.

TABLE 5

| No. | Glass (parts by weight) | εr | Q (3 GHz) | τf (ppm/°C.) |
| --- | --- | --- | --- | --- |
| *53 | 0.0 | 33 | 320 | — |
| 54 | 2.5 | 58 | 1200 | 3 |
| 55 | 5.0 | 65 | 1500 | 5 |
| 56 | 10.0 | 59 | 870 | 4 |
| *57 | 15.0 | 52 | 450 | 3 |

*comparative example
—: unmeasurable

EXAMPLE 5

Initially, highly pure barium carbonate, titanium oxide, neodymium oxide and bismuth oxide were weighed such that x, y, z and a in the above-indicated formula are 0.155, 0.670, 0.175 and 0.05, respectively. To the thus weighed components, there was further added alumina ($Al_2O_3$) in various proportions as indicated in TABLE 6, per 100 parts by weight of the total amount of the above components. A mixture of these components and alumina was calcined at 1270° C., and then pulverized to provide a calcined ceramic powder having the average grain size of 0.6 μm, in the same manner as EXAMPLE 1.

Subsequently, the glass powder prepared according to EXAMPLE 2 and having the composition (I) was added to the thus obtained calcined ceramic powder, in an amount of 5 parts by weight per 100 parts by weight of the ceramic powder. Then, the mixture of the glass powder and calcined ceramic powder was press-formed into a green sheet, and then fired, in the same manner as EXAMPLE 1.

The dielectric properties of each of fired samples No. 58 through No. 62 thus obtained were measured in the same manner as EXAMPLE 1. The results of the measurement are indicated in TABLE 6.

TABLE 6

| No. | Al2O3 (parts by weight) | εr | Q (3 GHz) | τf (ppm/°C.) |
| --- | --- | --- | --- | --- |
| 58 | 0.0 | 65 | 1500 | 5 |
| 59 | 0.6 | 62 | 1630 | 2 |
| 60 | 1.2 | 58 | 1650 | 0 |
| 61 | 2.0 | 52 | 1380 | −4 |
| 62 | 3.0 | 44 | 1030 | −8 |

EXAMPLE 6

Initially, highly pure barium carbonate, titanium oxide, neodymium oxide, samarium oxide, lanthanum oxide and bismuth oxide were weighed, to give test compositions corresponding to samples No. 63 through No. 73 of the above-indicated formula in which x, y, z and a are respectively determined as indicated in TABLE 7. To the thus weighed components, there was further added manganese oxide (MnO) in various proportions as indicated in TABLE 7, per 100 parts by weight of the total amount of the above components. A mixture of these components and manganese oxide was calcined at 1270° C., and then pulverized to provide a calcined ceramic powder having the average grain size of 0.6 μm, in the same manner as EXAMPLE 1.

The dielectric properties of each of fired samples Nos. 63–73 thus obtained were measured in the same manner as EXAMPLE 1. The results of the measurement are indicated in TABLE 7.

TABLE 7

| No. | x | y | z | RE | a | MnO (parts by weight) | Glass Comp. | Glass Parts by weight | εr | Q (3 GHz) | τf (ppm/°C.) |
| --- | --- | --- | --- | --- | --- | --- | --- | --- | --- | --- | --- |
| 63 | 0.165 | 0.670 | 0.165 | 0.95 Nd + 0.05 La | 0.05 | 0.5 | I | 5.0 | 65 | 1260 | 11 |
| 64 | 0.160 | 0.670 | 0.170 | Nd | 0.15 | 0.0 | G | 2.5 | 72 | 1030 | 5 |
| 65 | 0.160 | 0.670 | 0.170 | Nd | 0.15 | 0.5 | G | 2.5 | 71 | 1210 | 5 |
| 66 | 0.160 | 0.670 | 0.170 | Nd | 0.15 | 1.0 | G | 2.5 | 72 | 1170 | 3 |
| 67 | 0.160 | 0.670 | 0.170 | Nd | 0.15 | 2.0 | G | 2.5 | 70 | 1090 | 1 |
| 68 | 0.160 | 0.670 | 0.170 | Nd | 0.15 | 3.0 | G | 2.5 | 68 | 990 | −1 |
| 69 | 0.160 | 0.670 | 0.170 | Nd | 0.15 | 4.0 | G | 2.5 | 63 | 620 | −1 |
| *70 | 0.155 | 0.675 | 0.170 | 0.80 Nd + 0.20 Sm | 0.20 | 0.5 | I | 0.0 | 33 | 650 | — |
| 71 | 0.155 | 0.675 | 0.170 | 0.80 Nd + 0.20 Sm | 0.20 | 0.5 | I | 0.1 | 72 | 1140 | −3 |
| 72 | 0.155 | 0.675 | 0.170 | 0.80 Nd + 0.20 Sm | 0.20 | 0.5 | I | 3.0 | 73 | 1080 | −2 |
| *73 | 0.155 | 0.675 | 0.170 | 0.80 Nd + 0.20 Sm | 0.20 | 0.5 | I | 6.0 | 69 | 430 | — |

*comparative example
—:unmeasurable

EXAMPLE 7

Initially, highly pure barium carbonate, titanium oxide, neodymium oxide, samarium oxide, lanthanum oxide, alumina and manganese oxide were weighed so as to give test compositions corresponding to samples No. 74 through No. 96 and having respective values or amounts of x, y, z, RE, $Al_2O_3$ and MnO as indicated in TABLE 8. The thus weighed materials were wet-blended with some pure water in a polyethylene pot mill using alumina balls. The thus obtained mixture was taken out of the pot mill, dried, put into an alumina crucible, and calcined in air for four hours at 1250° C. Then, the calcined mixture was roughly crushed, thrown back into the polyethylene pot mill with zirconia balls, and pulverized to achieve the average grain size of 0.8 μm as measured by a laser diffraction and scattering method. In this manner, calcined ceramic powders of respective compositions were obtained.

On the other hand, highly pure zinc oxide, boric oxide and silicon oxide were weighed to give a composition (I) indicated in TABLE 3, which consists of 63% by weight of ZnO, 29% by weight of $B_2O_3$ and 8% by weight of $SiO_2$, or a composition (G) indicated in TABLE 3, which consists of 65% by weight of ZnO, 25% by weight of $B_2O_3$ and 10% by weight of $SiO_2$. These compounds were thrown with alumina balls into a polyethylene pot mill, and dry-blended. The thus obtained mixture was fused in a chamotte crucible, rapidly cooled off in water and thus vitrified. The glass obtained was thrown with alumina balls into an alumina pot mill, and pulverized in ethanol to achieve the average grain size of 4 μm, to thereby provide a glass powder having the composition (I) or (G).

Subsequently, each of the calcined ceramic powders of the test compositions was wet-blended in pure water with a predetermined amount (as indicated in TABLE 8) of the glass having the composition (I) or (G), in a polyethylene pot mill using zirconia balls. At the same time, 1% by weight of polyvinyl alcohol (PVA) was added as a binder. The thus obtained mixture was then dried, passed through a sieve having openings of 355 μm, and thus granulated. In TABLE 8, the amount of addition of the glass is represented by parts by weight per 100 parts by weight of the amount of the calcined ceramic powder, i.e., the main ceramic composition.

The thus prepared granules of each composition were formed with a press at a surface pressure of 1 t/cm², into a circular disc having a diameter of 20 mm and a thickness of 15 mm. The circular discs corresponding to the respective compositions were fired in air for two hours at 900° C., to thereby provide respective samples Nos. 74-96 of dielectric ceramics. These samples were ground into circular discs each having a diameter of 16 mm and a thickness of 8 mm, and the dielectric properties of each sample were measured. More specifically, the specific dielectric constant ($\epsilon r$) and unloaded Q were measured according to Hakki and Coleman method, while the temperature coefficient ($\tau f$) of the resonance frequency was measured over a range from $-25°$ C. to $75°$ C. The measurement was effected at a frequency of 2-4 GHz. The results of the measurement are also indicated in TABLE 8.

EXAMPLE 8

The calcined ceramic powder obtained in producing sample No. 86 of TABLE 8 was wet-blended in an alumina pot mill using zirconia balls, with the glass powder of the $ZnO$-$B_2O_3$-$SiO_2$ system having the composition (G) of TABLE 3, polyvinyl butyral (8 parts by weight), and suitable amounts of a plasticizer and a peptizing agent, within a mixed solution of toluene and isopropyl alcohol.

The thus prepared mixture was degassed, and formed by a doctor blade technique into green tapes each having a thickness of 250 μm. Then, a conductor pattern for a 900 MHz 3-resonator bandpass filter was printed on one of the thus formed green tapes, by using an Ag paste suited for printing. Thereafter, 20 sheets of the green tapes, including as an intermediate sheet the above-indicated one tape on which the conductor pattern was printed, were laminated at 100 kgf/cm² at 100° C. The laminated green tapes were cut into segments, and then fired in air for two hours at 900° C., to thereby provide stripline type filters. Upon measurement of the filter characteristics by means of a network analyzer, the thus obtained stripline type filters exhibited a center frequency of 930 MHz, and an insertion loss of 2.8 dB.

EXAMPLE 9

The main ceramic composition (in the form of calcined ceramic powder) as used for sample No. 88 of TABLE 8 was prepared, while glass powders having the compositions (N), (O), (P), (Q), (R) and (S) as indicated in TABLE 3 were prepared.

Then, the prepared calcined ceramic powder was wet-blended in pure water with the glass powder of each composition, in a polyethylene pot mill using alumina balls. The glass powder was contained in an amount of 5 parts by weight per 100 parts by weight of the calcined ceramic powder (main ceramic composition). The thus obtained mixture was granulated, and the granules of each composition was press-formed into a circular disc, in the same manner as EXAMPLE 7. The circular discs corresponding to the respective com-

TABLE 8

| No. | x | y | z | RE | $Al_2O_3$ (parts by weight) | MnO (parts by weight) | Glass Comp. | Glass Parts by weight | $\epsilon r$ | Q (3 GHz) | $\tau f$ (ppm/°C.) |
|---|---|---|---|---|---|---|---|---|---|---|---|
| 74 | 0.155 | 0.670 | 0.175 | Nd | 0.0 | 0.0 | I | 2.5 | 56 | 980 | 18 |
| 75 | 0.155 | 0.670 | 0.175 | Nd | 0.0 | 0.0 | I | 6.0 | 65 | 1220 | 15 |
| 76 | 0.125 | 0.695 | 0.180 | 0.80 Nd + 0.20 Sm | 0.0 | 0.0 | I | 4.0 | 50 | 1300 | 12 |
| 77 | 0.160 | 0.675 | 0.165 | 0.80 Nd + 0.20 Sm | 0.0 | 0.0 | I | 4.0 | 63 | 1150 | 16 |
| 78 | 0.180 | 0.700 | 0.120 | Nd | 0.0 | 0.0 | I | 2.5 | 40 | 1520 | 28 |
| 79 | 0.140 | 0.670 | 0.190 | 0.95 Nd + 0.05 La | 0.0 | 0.0 | I | 2.5 | 50 | 850 | 6 |
| 80 | 0.140 | 0.670 | 0.190 | 0.95 Nd + 0.05 La | 0.6 | 0.0 | I | 2.5 | 45 | 1160 | 1 |
| 81 | 0.140 | 0.670 | 0.190 | 0.95 Nd + 0.05 La | 1.2 | 0.0 | I | 2.5 | 43 | 1110 | −3 |
| 82 | 0.140 | 0.670 | 0.190 | 0.95 Nd + 0.05 La | 2.0 | 0.0 | I | 2.5 | 40 | 980 | −5 |
| 83 | 0.140 | 0.670 | 0.190 | 0.95 Nd + 0.05 La | 3.0 | 0.0 | I | 2.5 | 34 | 750 | −8 |
| 84 | 0.125 | 0.695 | 0.180 | 0.90 Nd + 0.10 Sm | 0.0 | 0.1 | I | 4.0 | 50 | 1450 | 10 |
| 85 | 0.150 | 0.665 | 0.185 | 0.80 Nd + 0.20 Sm | 0.0 | 0.5 | I | 4.0 | 62 | 1340 | 12 |
| 86 | 0.180 | 0.700 | 0.120 | 0.95 Nd + 0.05 La | 0.0 | 0.2 | I | 6.0 | 43 | 1700 | 18 |
| 87 | 0.160 | 0.670 | 0.170 | 0.90 Nd + 0.10 Sm | 0.0 | 0.0 | G | 5.0 | 65 | 1050 | 18 |
| 88 | 0.160 | 0.670 | 0.170 | 0.90 Nd + 0.10 Sm | 0.0 | 2.0 | G | 5.0 | 63 | 1190 | 16 |
| 89 | 0.160 | 0.670 | 0.170 | 0.90 Nd + 0.10 Sm | 0.0 | 3.0 | G | 5.0 | 60 | 1060 | 14 |
| 90 | 0.160 | 0.670 | 0.170 | 0.90 Nd + 0.10 Sm | 0.0 | 4.0 | G | 5.0 | 54 | 820 | 12 |
| *91 | 0.145 | 0.675 | 0.180 | 0.80 Nd + 0.20 Sm | 1.2 | 0.0 | G | 0.0 | 30 | 240 | — |
| 92 | 0.145 | 0.675 | 0.180 | 0.80 Nd + 0.20 Sm | 1.2 | 0.0 | G | 3.0 | 46 | 1070 | −3 |
| 93 | 0.145 | 0.675 | 0.180 | 0.80 Nd + 0.20 Sm | 1.2 | 0.0 | G | 5.0 | 53 | 1390 | −3 |
| 94 | 0.145 | 0.675 | 0.180 | 0.80 Nd + 0.20 Sm | 1.2 | 0.0 | G | 10.0 | 46 | 1110 | −4 |
| 95 | 0.145 | 0.675 | 0.180 | 0.80 Nd + 0.20 Sm | 1.2 | 0.0 | G | 15.0 | 45 | 970 | −4 |
| *96 | 0.145 | 0.675 | 0.180 | 0.80 Nd + 0.20 Sm | 1.2 | 0.0 | G | 20.0 | 43 | 420 | −5 |

*comparative example
—: unmeasurable positions were fired in air for two hours at 900° C., to thereby provide samples No. 97 through No. 102 of dielectric ceramics as indicated in TABLE 9. The dielectric properties of these samples were measured, and the results of the measurement are indicated in TABLE 9.

TABLE 9

| No. | Glass Composition | Parts by weight | $\epsilon r$ | Q (3 GHz) | $\tau f$ (ppm/°C.) |
|---|---|---|---|---|---|
| 97 | N | 5.0 | 49 | 1060 | 20 |
| 98 | O | 5.0 | 54 | 1210 | 19 |
| 99 | P | 5.0 | 63 | 1050 | 18 |
| 100 | Q | 5.0 | 66 | 1250 | 17 |
| 101 | R | 5.0 | 69 | 1200 | 15 |
| 102 | S | 5.0 | 70 | 1170 | 16 |

EXAMPLE 10

Initially, highly pure barium carbonate, strontium oxide, calcium oxide, titanium oxide, neodymium oxide, samarium oxide, lanthanum oxide and bismuth oxide were weighed to give main ceramic compositions corresponding to samples No. 103 through No. 117 and represented by the formula: $x[(1-c-d)BaO.cSrO.dCaO].yTiO_2.z[(1-e)RE_2O_3.eBi_2O_3]$ wherein x, y, z, RE, c, d and e are as indicated in TABLE 10. The thus weighed materials were wet-blended with pure water in a polyethylene pot mill using zirconia balls. The thus obtained mixture was taken out of the pot mill, dried, put into an alumina crucible, and calcined in air for four hours at 1250° C. Then, the calcined mixture was roughly crushed, thrown back into the polyethylene pot mill with zirconia balls, and pulverized to achieve the average grain size of 0.8 μm as measured by a laser diffraction and scattering method. In this manner, calcined ceramic powders of respective compositions were obtained.

On the other hand, highly pure zinc oxide, boric oxide and silicon oxide were weighed to give the composition (I) indicated in TABLE 3, which consists of 63% by weight of ZnO, 29% by weight of $B_2O_3$ and 8% by weight of $SiO_2$, or the composition (G) indicated in TABLE 3, which consists of 65% by weight of ZnO, 25% by weight of $B_2O_3$ and 10% by weight of $SiO_2$. These compounds were thrown with alumina balls into a polyethylene pot mill, and dry-blended. The thus obtained mixture was fused in a chamotte crucible, rapidly cooled off in water and thus vitrified. The glass obtained was thrown with alumina balls into an alumina pot mill, and pulverized in ethanol to achieve the average grain size of 4 μm, to thereby provide a glass powder having the composition (I) or (G).

Subsequently, each of the calcined ceramic powders of the test compositions was wet-blended in pure water with a predetermined amount (as indicated in TABLE 10) of the glass having the composition (I) or (G), in a polyethylene pot mill using alumina balls. At the same time, 1% by weight of polyvinyl alcohol (PVA) was added as a binder. The thus obtained mixture was then dried, passed through a sieve having openings of 355 μm, and thus granulated.

The thus prepared granules of each composition were formed with a press at a surface pressure of 1 t/cm², into a circular disc having a diameter of 20 mm and a thickness of 15 mm. The circular discs corresponding to the respective compositions were fired in air for two hours at 900° C., to thereby provide respective samples Nos. 103–117 of dielectric ceramics. These samples were ground into circular discs each having a diameter of 16 mm and a thickness of 8 mm, and the dielectric properties of each sample were measured. More specifically, the specific dielectric constant ($\epsilon r$) and unloaded Q were measured according to Hakki and Coleman method, while the temperature coefficient ($\tau f$) of the resonance frequency was measured over a range from $-25°$ C. to 75° C. The measurement was effected at a frequency of 2–4 GHz. The results of the measurement are also indicated in TABLE 10.

TABLE 10

| No. | x | y | z | RE | c | d | e | Glass Comp. | Parts by weight | $\epsilon r$ | Q (3 GHz) | $\tau f$ (ppm/°C.) |
|---|---|---|---|---|---|---|---|---|---|---|---|---|
| 103 | 0.125 | 0.695 | 0.180 | 0.90 Nd + 0.10 Sm | 0.25 | 0.0 | 0.0 | I | 6.0 | 55 | 1350 | 12 |
| 104 | 0.150 | 0.670 | 0.180 | 0.80 Nd + 0.20 Sm | 0.05 | 0.0 | 0.0 | I | 6.0 | 65 | 1250 | 13 |
| 105 | 0.180 | 0.700 | 0.120 | Nd | 0.35 | 0.0 | 0.0 | I | 7.0 | 45 | 1540 | 19 |
| 106 | 0.160 | 0.675 | 0.165 | Nd | 0.0 | 0.05 | 0.0 | I | 4.0 | 63 | 1180 | 18 |
| 107 | 0.155 | 0.670 | 0.175 | 0.95 Nd + 0.05 La | 0.10 | 0.00 | 0.10 | I | 3.0 | 70 | 1370 | 0 |
| 108 | 0.155 | 0.675 | 0.170 | Nd | 0.00 | 0.00 | 0.15 | G | 2.5 | 69 | 1050 | 6 |
| 109 | 0.155 | 0.675 | 0.170 | Nd | 0.20 | 0.00 | 0.15 | G | 2.5 | 67 | 1140 | 2 |
| 110 | 0.155 | 0.675 | 0.170 | Nd | 0.40 | 0.00 | 0.15 | G | 2.5 | 64 | 1030 | 0 |
| 111 | 0.155 | 0.675 | 0.170 | Nd | 0.50 | 0.00 | 0.15 | G | 2.5 | 57 | 840 | −3 |
| 112 | 0.155 | 0.675 | 0.170 | Nd | 0.00 | 0.20 | 0.15 | G | 2.5 | 70 | 960 | 9 |
| 113 | 0.155 | 0.675 | 0.170 | Nd | 0.00 | 0.30 | 0.15 | G | 2.5 | 70 | 470 | 13 |
| *114 | 0.155 | 0.660 | 0.185 | 0.90 Nd + 0.10 La | 0.10 | 0.05 | 0.25 | I | 0.0 | 36 | 540 | — |
| 115 | 0.155 | 0.660 | 0.185 | 0.90 Nd + 0.10 La | 0.10 | 0.05 | 0.25 | I | 1.0 | 69 | 1130 | −4 |
| 116 | 0.155 | 0.660 | 0.185 | 0.90 Nd + 0.10 La | 0.10 | 0.05 | 0.25 | I | 3.0 | 74 | 1010 | −3 |
| *117 | 0.155 | 0.660 | 0.185 | 0.90 Nd + 0.10 La | 0.10 | 0.05 | 0.25 | I | 6.0 | 71 | 360 | — |

*comparative example
—: unmeasurable

EXAMPLE 11

The calcined ceramic powder obtained in producing sample No. 109 of TABLE 10 was wet-blended in an alumina pot mill using zirconia balls, with the glass powder of the $ZnO-B_2O_3-SiO_2$ system having the composition (G) of TABLE 3, polyvinyl butyral (8 parts by weight), and suitable amounts of a plasticizer and a peptizing agent, within a mixed solution of toluene and isopropyl alcohol.

The thus prepared mixture was degassed, and formed by a doctor blade technique into green tapes each having a thickness of 250 μm. Then, a conductor pattern for a 900 MHz 3-resonator bandpass filter was printed on one of the thus formed green tapes, by using an Ag paste suited for printing. Thereafter, 12 sheets of the green tapes, including as an intermediate sheet the above-indicated one tape on which the conductor pattern was printed, were laminated at 100 kgf/cm² at 100° C. The laminated green tapes were cut into segments, and then fired in air for two hours at 900° C., to thereby provide stripline type filters. Upon measurement of the filter characteristics by means of a network analyzer, the thus obtained stripline type filters exhibited a center frequency of 930 MHz, and an insertion loss of 2.8 dB.

EXAMPLE 12

The main ceramic composition (in the form of calcined ceramic powder) as used for sample No. 109 of TABLE 10 was prepared, while glass powders having the compositions (N), (O), (P), (Q), (R) and (S) as indicated in TABLE 3 were prepared.

Then, the prepared calcined ceramic powder was wet-blended in pure water with the glass powder of each composition, in a polyethylene pot mill using alumina balls. The glass powder was contained in an amount of 2.5 parts by weight per 100 parts by weight of the calcined ceramic powder (main ceramic composition). The thus obtained mixture was granulated, and the granules of each composition was press-formed into a circular disc, in the same manner as EXAMPLE 10. The circular discs corresponding to the respective compositions were fired in air for two hours at 900° C., to thereby provide samples No. 118 through No. 123 of dielectric ceramics as indicated in TABLE 11. The dielectric properties of these samples were measured, and the results of the measurement are indicated in TABLE 11.

TABLE 11

| No. | Glass Composition | Parts by weight | $\epsilon r$ | Q (3 GHz) | $\tau f$ (ppm/°C.) |
|---|---|---|---|---|---|
| 118 | N | 2.5 | 52 | 1000 | 4 |
| 119 | O | 2.5 | 57 | 1150 | 4 |
| 120 | P | 2.5 | 68 | 1120 | 1 |
| 121 | Q | 2.5 | 71 | 1200 | 2 |
| 122 | R | 2.5 | 73 | 1080 | 1 |
| 123 | S | 2.5 | 73 | 1020 | −1 |

The dielectric ceramic compositions prepared according to the above EXAMPLES 1–12 can be fired or sintered at 1000° C. or lower, preferably, at around 900° C. The dielectric ceramics obtained from the present dielectric compositions are advantageously used for producing a dielectric filter, such as a stripline type filter, which incorporates internal conductive layers formed solely of Ag having a relatively low conductivity resistance, or of alloys containing Ag as a major component. Further, the dielectric ceramics exhibit a sufficiently high specific dielectric constant, a sufficiently large unloaded Q and a significantly reduced temperature coefficient of the resonance frequency.

What is claimed is:

1. A dielectric ceramic composition which consists essentially of: a main ceramic composition containing barium oxide, titanium oxide and rare earth oxide as major components, which composition is represented by $xBaO \cdot yTiO_2 \cdot zRE_2O_3$ where RE represents at least one rare earth metal, $0.10 \leq x \leq 0.20$, $0.60 \leq y \leq 0.75$, $0.10 \leq z \leq 0.25$, and $x+y+z=1$; and a glass composition composed of ZnO, $B_2O_3$ and $SiO_2$, which is represented by $k(wt.\%)ZnO \cdot m(wt.\%)B_2O_3 \cdot n(wt.\%)SiO2$ where $30 \leq k \leq 85$, $5 \leq m \leq 50$, $2 \leq n \leq 40$, $k+m+n=100$, said glass composition being contained in an amount of 0.1~18 parts by weight per 100 parts by weight of said main ceramic composition.

2. A dielectric ceramic composition according to claim 1, wherein said main ceramic composition further contains not more than 2.5 parts by weight of alumina per 100 parts by weight of a total amount of said major components.

3. A dielectric ceramic composition according to claim 2, wherein said alumina is contained in said main ceramic composition, in an amount of not more than 2 parts by weight per 100 parts by weight of the total amount of said major components.

4. A dielectric ceramic composition according to claim 1, wherein said main ceramic composition further contains not more than 3 parts by weight of manganese oxide per 100 parts by weight of a total amount of said major components.

5. A dielectric ceramic composition according to claim 4, wherein said manganese oxide is contained in said main ceramic composition, in an amount of not more than 2 parts by weight per 100 parts by weight of the total amount of said major components.

6. A dielectric ceramic composition according to claim 1, wherein said at least one rare earth metal represented by RE is selected from the group consisting of Nd, Sm, La, Ce and Pr.

7. A dielectric ceramic composition according to claim 6, wherein said at least one rare earth metal (RE) consists of Nd.

8. A dielectric ceramic composition according to claim 6, wherein said at least one rare earth metal (RE) is a combination of Nd and Sm and/or La.

9. A dielectric ceramic composition according to claim 1, wherein said glass composition consists of 40–75 wt. % of said ZnO ($40 \leq k \leq 75$), 10–40 wt. % of said $B_2O_3$ ($10 \leq m \leq 40$), and 5–30 wt. % of said $SiO_2$ ($5 \leq n \leq 30$).

* * * * *